United States Patent
Kwak et al.

(10) Patent No.: US 11,192,336 B2
(45) Date of Patent: Dec. 7, 2021

(54) ZINC ALLOY PLATED STEEL HAVING EXCELLENT WELDABILITY AND CORROSION RESISTANCE

(71) Applicant: POSCO, Pohang-si (KR)

(72) Inventors: Young-Jin Kwak, Gwangyang-si (KR); Du-Youl Choi, Incheon (KR)

(73) Assignee: POSCO, Gyeongsangbuk-Do (KR)

(*) Notice: Subject to any disclaimer, the term of this patent is extended or adjusted under 35 U.S.C. 154(b) by 0 days.

(21) Appl. No.: 16/472,445

(22) PCT Filed: Dec. 21, 2017

(86) PCT No.: PCT/KR2017/015221
§ 371 (c)(1),
(2) Date: Jun. 21, 2019

(87) PCT Pub. No.: WO2018/124629
PCT Pub. Date: Jul. 5, 2018

(65) Prior Publication Data
US 2019/0366687 A1      Dec. 5, 2019

(30) Foreign Application Priority Data
Dec. 26, 2016 (KR) .................. 10-2016-0178836

(51) Int. Cl.
*B32B 15/01* (2006.01)
*C22C 38/00* (2006.01)
(Continued)

(52) U.S. Cl.
CPC .......... *B32B 15/013* (2013.01); *C22C 38/002* (2013.01); *C22C 38/02* (2013.01);
(Continued)

(58) Field of Classification Search
None
See application file for complete search history.

(56) References Cited

U.S. PATENT DOCUMENTS 5,002,837 A * 3/1991 Shimogori .............. C23C 14/16
                                                        428/621
5,021,301 A   6/1991 Nakakoji et al.
(Continued)

FOREIGN PATENT DOCUMENTS

| CN | 101910466 | 12/2010 |
|----|-----------|---------|
| CN | 103249860 | 8/2013  |

(Continued)

OTHER PUBLICATIONS

International Search Report—PCT/KR2017/015221 dated Apr. 20, 2018.

(Continued)

*Primary Examiner* — Daniel J. Schleis
(74) *Attorney, Agent, or Firm* — Cantor Colburn LLP (57) ABSTRACT

Provided are a zinc alloy plated steel and a method for manufacturing same, the zinc alloy plated steel comprising: a base iron; a Zn plated layer formed on top of the base iron; and a Zn—Mg alloy layer formed on top of the Zn plated layer and obtained through mutual diffusion of Zn and Mg, wherein the ratio of the weight of Mg contained in the Zn—Mg alloy layer with respect to the total weight of the Zn plated layer and the Zn—Mg alloy layer is 0.13 to 0.24, and the sum of the adhesion quantity of the Zn layer and the Zn—Mg alloy layer is no more than 40 g/m² (more than 0 g/m²).

9 Claims, 4 Drawing Sheets

(51) Int. Cl.
| | |
|---|---|
| *C22C 38/02* | (2006.01) |
| *C22C 38/04* | (2006.01) |
| *C22C 38/06* | (2006.01) |
| *C23C 14/16* | (2006.01) |
| *C23C 14/26* | (2006.01) |
| *C23C 14/58* | (2006.01) |
| *C23C 28/02* | (2006.01) |
| *C25D 3/22* | (2006.01) |
| *C25D 5/50* | (2006.01) |

(52) U.S. Cl.
CPC .............. *C22C 38/04* (2013.01); *C22C 38/06* (2013.01); *C23C 14/16* (2013.01); *C23C 14/26* (2013.01); *C23C 14/5806* (2013.01); *C23C 28/025* (2013.01); *C25D 3/22* (2013.01); *C25D 5/50* (2013.01)

(56) References Cited

U.S. PATENT DOCUMENTS

| | | | |
|---|---|---|---|
| 5,135,817 | A | 8/1992 | Shimogori et al. |
| 9,267,203 | B2 | 2/2016 | Nam et al. |
| 9,738,958 | B2 | 8/2017 | Chin et al. |
| 2010/0003538 | A1 | 1/2010 | Nikolov et al. |
| 2010/0285333 | A1 | 11/2010 | Kwak et al. |

FOREIGN PATENT DOCUMENTS

| | | |
|---|---|---|
| CN | 103370434 | 10/2013 |
| EP | 0424856 | 5/1991 |
| JP | 01139755 | 6/1989 |
| JP | H02194162 | 7/1990 |
| JP | H07207430 | 8/1995 |
| JP | 09228030 | 9/1997 |
| JP | 10068063 | 3/1998 |
| JP | 2002275611 | 9/2002 |
| JP | 2006265671 | 10/2006 |
| JP | 2010275633 | 12/2010 |
| JP | 2011508088 | 3/2011 |
| KR | 19910008175 | 5/1991 |
| KR | 20090072381 | 7/2009 |
| KR | 20160054111 A | * 11/2014 |
| KR | 101536453 | 7/2015 |
| KR | 20160054111 | 5/2016 |
| KR | 101665880 | 10/2016 |

OTHER PUBLICATIONS

European Search Report—European Application No. 17888068.8, dated Oct. 30, 2019, citing US 5 002 837, KR 2015 0071883, US 2010/003538 and Schuhmacher, et al.

Schuhmacher, et al., Novel coating systems based on PVD for steel sheet, Vakuum in Forschung und Praxis, 2001, pp. 233-235.

Japanese Office Action—Japanese Application No. 2019-534696 dated Sep. 15, 2020, citing JP 2011-508088, JP H02-194162, and JP H07-207430.

Chinese Office Action—Chinese Application No. 201780080848.1 dated Jan. 13, 2021, citing US 5002837, CN 103370434, CN 103249860, EP 0424856, CN 101910466, and JP 2006-265671.

Chinese Office Action—Chinese Application No. 201780080848.1 dated Sep. 3, 2021, citing Jiang, et al.

Jiang, et al., Electrochemical Corrosion Behavior of Nanocrystalline Zinc Coatings In 3.5% NaCl SOLUTION, Journal of Chinese Society for Corrosion and Protection, Oct. 2008, vol. 28, No. 5.

* cited by examiner

ZINC ALLOY PLATED STEEL HAVING EXCELLENT WELDABILITY AND CORROSION RESISTANCE

TECHNICAL FIELD

The present disclosure relates to a zinc alloy plated steel having excellent weldability and corrosion resistance, and more particularly, a zinc alloy plated steel having excellent weldability and corrosion resistance applied to vehicles, home appliances, and construction materials, and the like.

BACKGROUND ART

As a zinc plating method which may prevent corrosion of iron through a cathodic protection method has excellent method performance and is highly economical, the method has been widely used for manufacturing a steel material having high corrosion resistance properties, and the consumption of a galvanized steel material plated with zinc has increased in overall industrial fields of vehicles, home appliances, construction materials, and the like.

A galvanized steel material may have sacrificial corrosion protection properties such that, when a galvanized steel material is exposed to a corrosion environment, zinc having oxidation-reduction potential lower than oxidation-reduction potential of iron may be corroded first, and corrosion of iron may be prevented. Also, a galvanized steel material may form a dense corrosion product on a surface of the steel material as zinc of a plating layer is oxidized, and the steel material may be protected from an oxidization atmosphere such that corrosion resistance of the steel material may improve.

However, air pollution has increased and a corrosion environment has been increasingly deteriorated due to high industrialization, and the demand for developing a steel material having more improved corrosion resistance than that of a conventional hot-dip galvanized steel material has increased due to strict regulations on saving resources and energy. Accordingly, various studies of a technique of manufacturing a zinc alloy plated steel material which may improve corrosion resistance of a steel material by adding elements such as magnesium (Mg), and the like, to a plating layer have been conducted.

Meanwhile, generally, a galvanized steel material or an zinc alloy plated steel material (hereinafter, referred to as "zinc-based plated steel") may be processed to a component through processing, and the like, may be welded through spot-welding, and may be used as a product. However, in the case of a zinc-based plated steel using a high strength steel material including austenite or retained austenite as a microstructure, a high P added high strength IF (Interstitial Free) steel material, and the like, as a base, there may be the problem of LME (liquid metal embrittlement) in which hot-dip state zinc may permeate along a grain boundary of a base steel during spot-welding and may cause embrittlement cracks.

Figure 1:
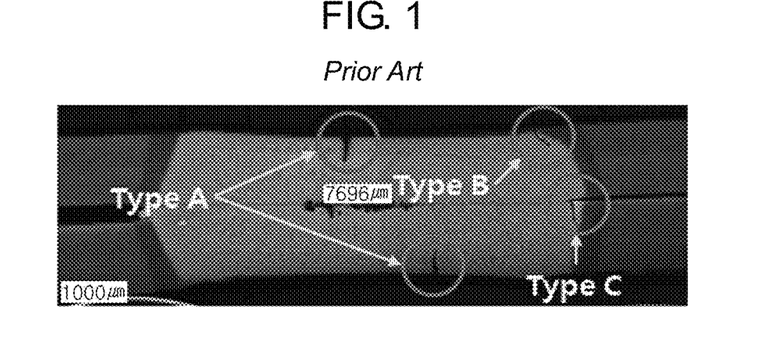
FIG. 1 is an image obtained by magnifying and observing a welded portion of a welding member on which LME cracks are created due to spot-welding.

FIG. 1 is an image obtained by magnifying and observing a welded portion of a welding member in which LME cracks occur by a spot-welding process. In FIG. 1, cracks created on upper and lower portions of nugget may be referred to as Type A cracks, cracks created on a welding shoulder portion may be referred to as Type B cracks, and cracks created in a steel sheet by misalignment of electrodes during welding may be referred to as Type C cracks. As Type B and C cracks may greatly affect stiffness of a material, the prevention of the cracks during welding may be a key requirement matter in the corresponding technical field.

DISCLOSURE

Technical Problem

An aspect of the present disclosure is to provide a zinc alloy plated steel having excellent weldability and corrosion resistance.

Technical Solution

According to an aspect of the present disclosure, a zinc alloy plated steel is provided, the zinc alloy plated steel including a base steel, a Zn plated layer formed on the base steel, and a Zn—Mg alloy plated layer formed on the Zn plated layer and obtained through mutual diffusion of Zn and Mg, and a ratio of weight of Mg contained in the Zn—Mg alloy plated layer based on a total weight of the Zn plated layer and the Zn—Mg alloy plated layer is 0.13 to 0.24, and a sum of coating amounts of the Zn plated layer and the Zn—Mg alloy plated layer is 40 g/m$^2$ or less (excluding 0 g/m$^2$).

According to another aspect of the present disclosure, a method of manufacturing a zinc alloy plated steel is provided, the method including preparing a Zn plated steel sheet including a Zn plated layer formed thereon, generating deposition vapor by lifting and heating a coating material by electromagnetic force in a vacuum chamber, and forming an Mg deposition layer by induction-spraying the deposition vapor on a surface of the Zn plated layer, forming a Zn—Mg alloy layer by performing a heat treatment on the Zn plated steel sheet including the Mg deposition layer formed thereon at a temperature of 250° C. or higher to less than 320° C., and a ratio of a weight of the Mg deposition layer based on a total weight of the Zn plated layer and the Mg deposition layer is 0.13 to 0.24, and a sum of coating amounts of the Zn plated layer and the Zn—Mg alloy plated layer is 40 g/m$^2$ or less (excluding 0 g/m$^2$).

Advantageous Effects

As one of effects of the present disclosure, a zinc alloy plated steel according to the present disclosure may have an advantage in that the zinc alloy plated steel may have excellent weldability, and accordingly, even when the zinc alloy plated steel uses a high strength steel material including austenite or retained austenite as a microstructure, a high P added high strength Interstitial Free (IF) steel material, and the like, as a base, liquid metal embrittlement (LME) may be effectively prevented.

Also, a multilayer zinc alloy plated steel according to the present disclosure may secure excellent corrosion resistance with even a small coating amount, and may thus be eco-friendly and highly economical, which may also be advantageous.

The advantages and effect of the present disclosure are not limited to those described above, and may be more easily understood in the process of describing specific example embodiments.

BEST MODE FOR INVENTION

In the case of a Zn—Mg alloy plated steel, an increased content of Mg may be more advantageous to corrosion resistance, but may be disadvantageous to weldability. Accordingly, generally, a content of Mg in a plated layer has been managed to be 10 wt % as a maximum content. That is because a Zn—Mg based intermetallic compound having a low melting point in a Zn—Mg alloy plated layer may be easily dissolved and may cause liquid metal embrittlement. However, as a result of additional research of the inventors of the present disclosure, the inventors have found that, even when a content of Mg in a plated layer exceeds 10 wt %, if an average content thereof is within a certain range, and an average grain size of grains forming the Zn—Mg alloy plated layer is within a certain range, weldability may rather significantly improve, and the present disclosure is suggested.

In the description below, a zinc alloy plated steel having excellent weldability and corrosion resistance will be described in detail.

The zinc alloy plated steel may include a base steel and a Zn plated layer and a Zn—Mg alloy plated layer sequentially formed on the base steel. In the present disclosure, a form of the base steel may not be particularly limited. For example, the base steel may be a steel sheet or a steel wire rod.

Also, in the present disclosure, a composition of the base steel may not be particularly limited as well. As an example, the base steel may include, by wt %, 0.10 to 1.0% of C, 0.5 to 3% of Si, 1.0 to 25% of Mn, 0.01 to 10% of Al, 0.1% or less of P (excluding 0%), 0.01% or less of S (excluding 0%), and a balance of Fe and inevitable impurities. In this case, the contents of C, Si, Mn, P, and S may satisfy Relational Expression 1 below. Meanwhile, the base steel having the composition as described above may include austenite or retained austenite as a microstructure.

$$[C]+[Mn]/20+[Si]/30+2[P]+4[S] \geq 0.3 \quad \text{[Relational Expression 1]}$$

(where [C], [Mn], [Si], [P], and [S] each indicate a content (wt %) of each element)

When the base steel has the above-described alloy composition and microstructure, liquid metal embrittlement (LME) may become a problem during spot-welding, and the reason is as follows. An austenite or retained austenite microstructure may have a vulnerable grain boundary as compared to another microstructure. When stress is applied by spot-welding, liquid molten zinc may permeate a grain boundary of an austenite or retained austenite microstructure on a welded portion and may cause cracks, and liquid metal embrittlement may occur.

However, as described below, in the present disclosure, as the time for which liquid molten zinc remains is significantly reduced, even when a zinc alloy plated steel is manufactured using a steel material having the above-described alloy composition and microstructure as a base, liquid metal embrittlement may be effectively prevented. Also, the present disclosure may also be applied even when an alloy composition of the base steel does not satisfy the above-described range.

The Zn plated layer may be formed on the base steel and may protect the base steel from a corrosion environment. The Zn plated layer may be formed by one of an electroplating method, a hot-dip plating method, and a physical vapor deposition (PVD) method.

When the Zn plated layer is formed by a hot-dip plating method, $Fe_2Al_5$ with high resistance may be inevitably present on an interfacial surface between the base steel and the Zn plated layer, non-conductive $Al_2O_3$ may be created on electrodes during welding, and a thickness deviation of the plated layer may relatively increase, which may be disadvantageous in terms of spot-weldability. In consideration thereof, the Zn plated layer may be an electroplated layer or a plated layer formed by a physical vapor deposition method preferably.

The Zn—Mg alloy plated layer may be formed on the Zn plated layer, and may be obtained by mutual diffusion between Zn and Mg in the Zn plated layer and an Mg deposition layer as described below.

In the present disclosure, a ratio of a weight of Mg contained in the Zn—Mg alloy plated layer based on a total weight of the Zn plated layer and the Zn—Mg alloy plated layer is 0.13 to 0.24. A more preferable ratio of a weight of Mg may be 0.157 to 0.20.

Figure 2:
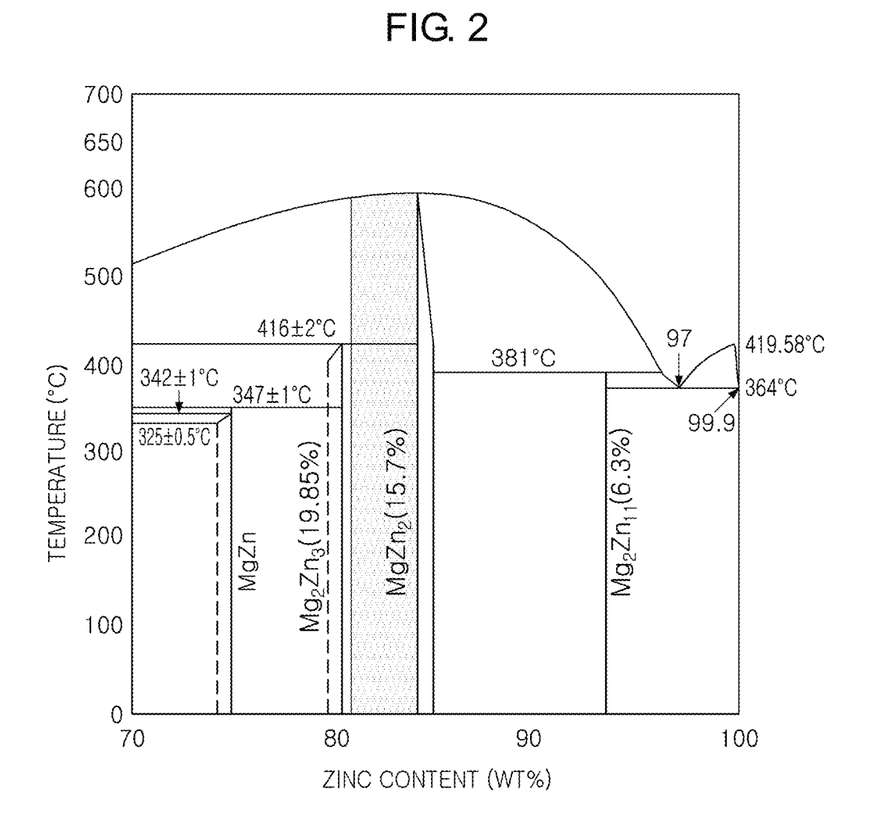
FIG. 2 is a phase diagram of Mg—Zn binary-system alloy.

The Zn—Mg alloy plated layer may include a Zn single phase, an Mg single phase, an $Mg_2Zn_n$ alloy phase, an $MgZn_2$ alloy phase, an $MgZn$ alloy phase, an $Mg_7Zn_3$ alloy phase, and the like. The inventors of the present disclosure have found that, when a ratio of a weight of Mg contained in the Zn—Mg alloy plated layer based on a total weight of the Zn plated layer and the Zn—Mg alloy plated layer is controlled to be within the above-described range, the Zn plated layer and the Zn—Mg alloy plated layer on a welded portion may be melted and transformed to an alloy layer formed as a single layer including an $MgZn_2$ alloy phase of 90 area % or higher (including 100 area %) during spot-welding, and that, in this case, liquid metal embrittlement (LME) may be effectively prevented. Presumably, that is because the time for which the melted plated layer remains as liquid may be significantly reduced as a melding point of the plated layer is high, as indicated in FIG. 2 illustrating a phase diagram of Mg—Zn binary-system alloy. Meanwhile, in the present disclosure, a residual microstructure other than an $MgZn_2$ alloy phase in the plated layer on the welded portion may not be particularly limited. However, according to an example embodiment, but not limited thereto, a residual microstructure other than an $MgZn_2$ alloy phase may be an $Mg_2Zn_{11}$ alloy phase.

A phase fraction may be analyzed and measured by a standardless Rietveld quantitative analysis method using a general XRD and also using a more accurate TEM-ASTAR (TEM-based crystal orientation mapping technique), but the method may not be limited thereto. Meanwhile, a phase transformation process of the the Zn—Mg alloy plated layer may be analyzed using a high-temperature in-situ radiation XRD. More specifically, a phase transformation process of the Zn—Mg alloy plated layer may be analyzed by, while heating a sample at heating rates of 1.3° C./sec and 11.3° C./sec, and at a heating temperature of 780° C., consecutively measuring an XRD spectrum of each frame per 1 second throughout 900 frames during a heating and cooling thermal cycle. However, an example analysis method is mot limited thereto.

Figure 3:
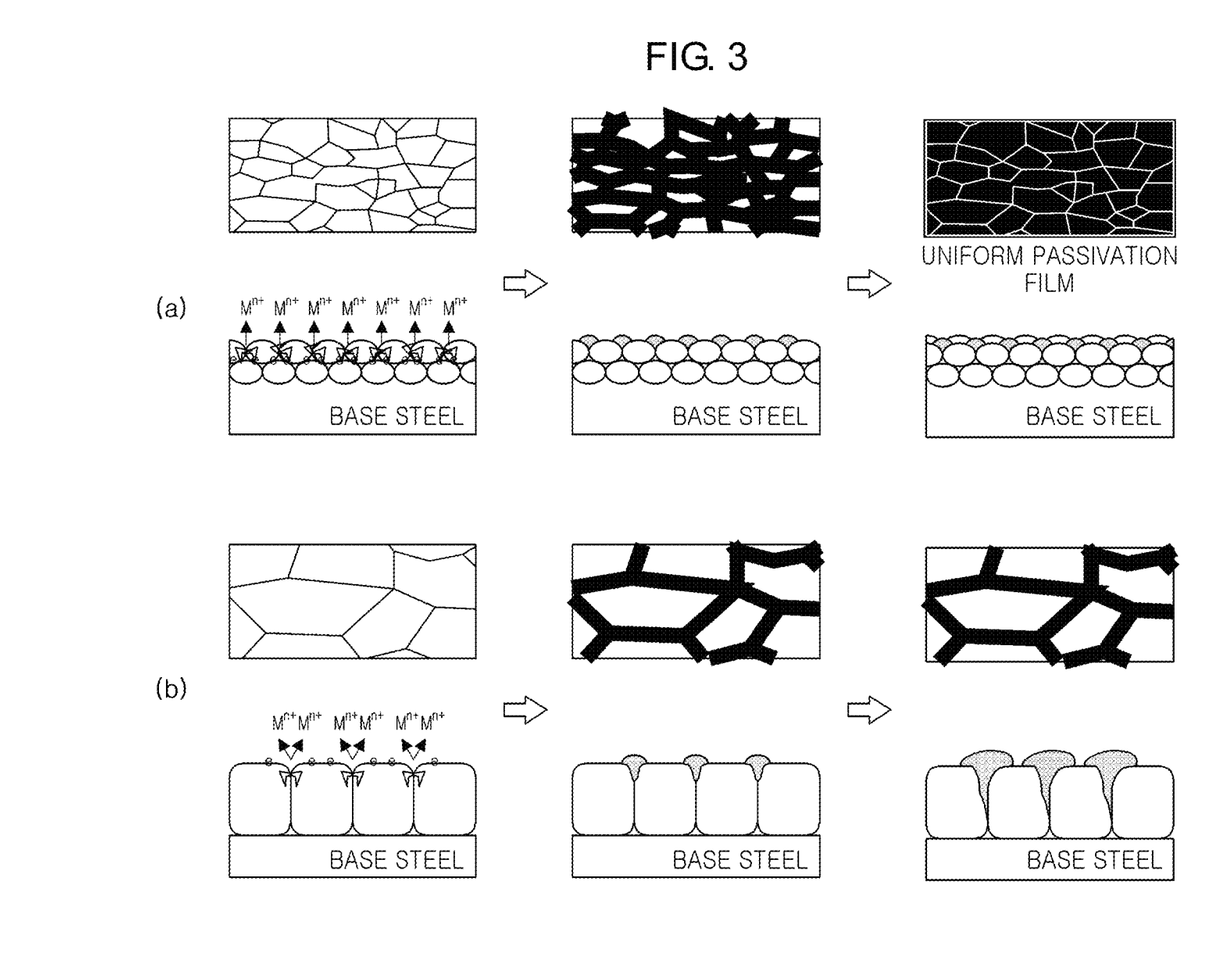
FIG. 3 is a diagram illustrating a corrosion process of a plated steel material.

According to the result of additional research of the inventors of the present disclosure, an average grain size of grains forming the Zn—Mg alloy plated layer may significantly affect corrosion resistance of a plated steel material. FIG. 3 is a diagram illustrating a process of corrosion of a plated steel material. FIG. 3(a) is a diagram illustrating an example in which a grain size is fine, and FIG. 3(b) is an example in which a grain size is coarse. Referring to FIG. 3, it has been found that, when a grain size is fine, a relatively dense and uniform corrosion product may be formed during corrosion, which may be relatively helpful to delay corrosion.

Also, an average grain size of grains forming the Zn—Mg alloy plated layer may significantly affect weldability of a plated steel material. When an average grain size of grains is a certain level or lower, the creation of Type B cracks may be significantly reduced, and presumably, that is because the active movement of atoms in the melted plated layer may be advantageous to securing an aimed microstructure.

As described above, considering both corrosion resistance and weldability of the plated steel material, it may be required to appropriately manage an upper limit of an average grain size of grains forming the Zn—Mg alloy plated layer, and it may be preferable to control an average grain size of grains forming the Zn—Mg alloy plated layer to be 100 nm or less (excluding 0 nm). The average grain size may refer to an average long diameter of grains detected by observing a cross-sectional surface of the plated layer taken in a thickness direction.

According to an example embodiment, a sum of coating amounts of the Zn plated layer and the Zn—Mg alloy plated layer may be 40 g/m$^2$ or less (excluding 0 g/m$^2$). The greater the sum of coating amounts of the Zn plated layer and the Zn—Mg alloy plated layer, it may be more advantageous in terms of corrosion resistance. However, due to an increased coating amount, liquid metal embrittlement (LME) may be caused during spot-welding. Thus, considering the aspect of weldability, an upper limit thereof may be limited as above. Meanwhile, a more preferable range of a sum of coating amounts of the Zn plated layer and the Zn—Mg alloy plated layer may be 10 to 35 g/m$^2$, and an even more preferable range may be 15 to 30 g/m$^2$.

The zinc alloy plated steel described above may be manufactured by various methods, and the manufacturing method may not be particularly limited. However, as an example embodiment, the zinc alloy plated steel may be manufactured by the method as below.

Foreign objects on a surface of the base steel may be removed by washing, rinsing, and drying the surface using an HCl solution of 14 weight % or higher, a natural oxide film may be removed using a plasma and an ion beam, and the surface may be plated with Zn, thereby preparing a Zn plated steel material including a Zn plated layer formed thereon. As described above, the Zn plated layer on the base steel may be formed by an electroplating method or a physical vapor deposition method.

An Mg deposition layer may be formed on the Zn plated layer. The Mg deposition layer may be formed by an electromagnetic levitation physical vapor deposition method having an electromagnetic stirring effect preferably.

Figure 4:
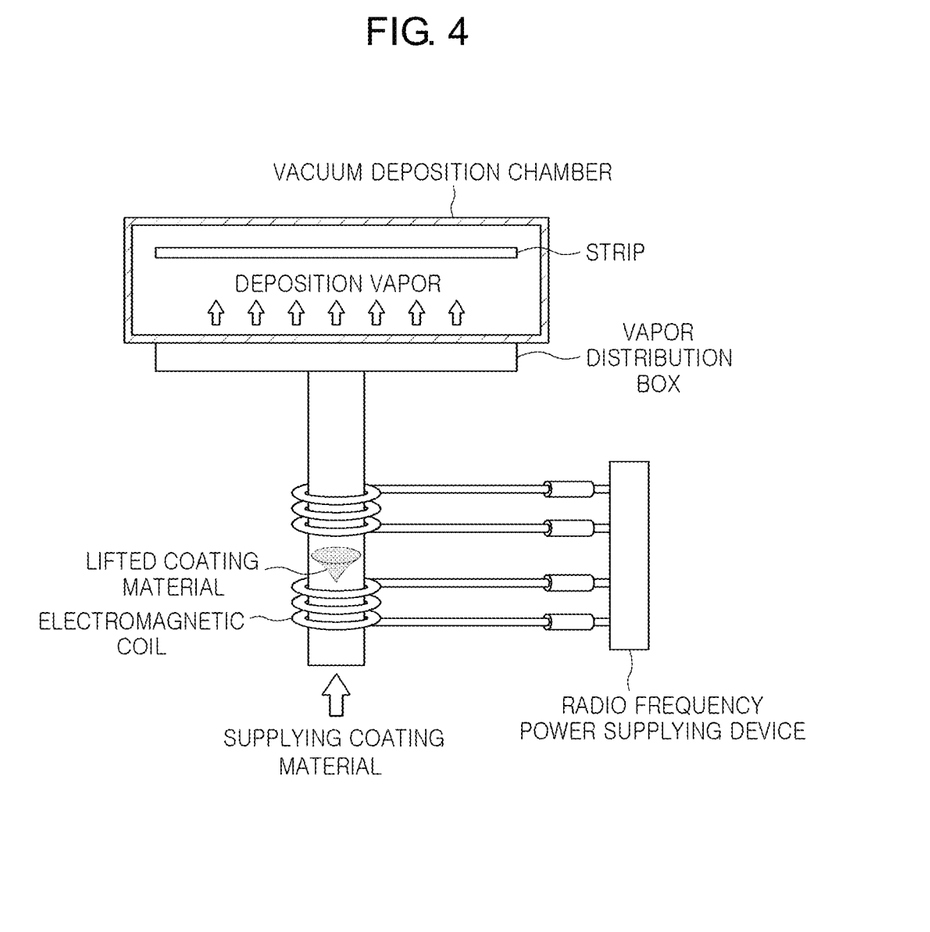
FIG. 4 is a diagram illustrating an electromagnetic levitation physical vapor deposition device.

The electromagnetic levitation physical vapor deposition method may refer to a method using a phenomenon in which, when electromagnetic force is generated by applying radio frequency power to a pair of electromagnetic coils generating an alternating current electromagnetic field, a coating material (Mg in the present disclosure) may be lifted in the air in the space surrounded by an alternating current electromagnetic field without any external help, and the lifted coating material may generate a large amount of deposition vapor (metal vapor). FIG. 4 is a diagram illustrating a device for such electromagnetic levitation physical vapor deposition. Referring to FIG. 4, a large amount of deposition vapor formed by the above-described method may be sprayed onto a surface of a material to be coated through a plurality of nozzles of a vapor distribution box at a high speed and may form a deposition layer.

In a general vacuum deposition device, a coating material may be provided in a crucible, and vaporization of the coating material may be performed by heating the crucible including the coating material. In this case, there may be a difficulty in providing sufficient thermal energy to the coating material because of dissolution of the crucible, heat loss caused by the crucible, and the like. Accordingly, a deposition speed may be slow, and there may be a certain limitation in refining a size of grains forming the deposition layer.

However, when the deposition is performed by an electromagnetic levitation physical vapor deposition method, differently from a general vacuum deposition method, there may be no constraint conditions related to a temperature, and the coating material may be exposed to a higher temperature. Accordingly, a high speed deposition may be performed, and consequently, the refinement of a size of grains forming the formed deposition layer may be achieved, which may be advantageous.

During the deposition process, a degree of vacuum in the vacuum chamber may be adjusted to $1.0\times10^{-3}$ mbar to $1.0\times10^{-5}$ mbar preferably. In this case, an increase of embrittlement and degradation of properties caused by an oxide formed during forming the deposition layer may be effectively prevented.

During the deposition process, it may be preferable to adjust a temperature of the lifted coating material to be 700° C. or higher, and it may be more preferable to adjust the temperature to be 800° C. or higher, and it may be even more preferable to adjust the temperature to be 1000° C. or higher. When the temperature is less than 700° C., there may be the problem in which an effect of refinement of grains may not be sufficiently secured. Meanwhile, the higher the temperature of the lifted coating material, it may be more advantageous to achieve a technical effect aimed in the present disclosure, and thus, in the present disclosure, an upper limit thereof may not be particularly limited. However, when the temperature is a certain level or higher, the effect thereof may be saturated, and process costs may significantly increase. In consideration thereof, an upper limited may be limited to 1500° C.

It may be preferable to adjust a temperature of the Zn plated steel material to be 100° C. or lower before and after the deposition. When the temperature exceeds 100° C., the maintained degree of vacuum may be interfered with by bending in a width direction caused by unevenness of a temperature of a width steel sheet while passing through a multiple-stage differentiated pressure reducing system at an exit side.

A heat treatment may be performed on the Zn plated steel material including the Mg deposition layer formed thereon at 250° C. or higher, and a Zn—Mg alloy plated layer may be formed. The reason why the heat treatment temperature is limited to 250° C. or higher is that, when the heat treatment temperature is less than 250° C., mutual diffusion between Zn and Mg in the Zn plated layer and the Mg deposition layer may not be performed easily. Meanwhile, an upper limit of the heat treatment temperature may not be particularly limited in the present disclosure, but when the temperature is 320° C. or higher, a brittle zinc and icon alloy phase may be formed on an interfacial surface between the base steel and the Zn plated layer, and it may be disadvantageous in terms of sealer adhesion properties. In consideration thereof, an upper limit thereof may be limited to less than 320° C.

In the present disclosure, the heat treatment method may not be particularly limited. For example, the method may be an induction heat method or an infrared heating method, and a heating time may be 3 seconds to 100 seconds. When the heating time is less than 3 seconds, the alloying may not be sufficiently performed such that the Mg deposition layer may partially remain. When the heating time exceeds 100 seconds, the steel sheet and the Zn plated layer may be alloyed with each other.

MODE FOR INVENTION

In the description below, an embodiment of the present disclosure will be described in detail. The below embodiment is provided for understanding of the present disclosure, and will not limit the present disclosure.

Embodiment

An electro-galvanized plated steel sheet having an electro-galvanized layer formed thereon and having a thickness as in Table 1 below was prepared on a high strength cold-rolled steel sheet used for vehicles, including, by wt %, 0.16% of C, 1.43% of Si, 2.56% of Mn, 0.04% of Al, 0.006% of P, 0.0029% of S, and a balance of Fe and inevitable impurities, and having a thickness of 1.4 mm, and an Mg deposition layer having a thickness as in Table 1 below was formed using a device (a degree of vacuum, $3.2 \times 10^{-3}$ mbar) illustrated in FIG. 4. In overall embodiments, when the Mg deposition layer is formed, a current applied to a pair of electromagnetic coils was 1.2 kA, a frequency applied to a pair of electromagnetic coils was 60 kHz with reference to 2 kg of a deposition material, a temperature of a lifted coating material was 1000° C., and a temperature of vapor distribution box was 900° C., constantly. Also, a temperature of the base steel before and after the deposition was maintained at 60° C. The electro-galvanized plated steel sheet including the Mg deposition layer passed through an exit strip-lock and was discharged into the air, and an alloying heat treatment was performed on the electro-galvanized plated steel sheet in a heat treatment zone using an induction heating process. In overall embodiments, a heat treatment temperature was 280° C., and a heat treatment time was 10 seconds, constantly.

Thereafter, a total coating amount and a ratio of a weight of Mg of the manufactured zinc alloy plated steel were measured by an ICP (inductively coupled plasma) method. More specifically, the steel material was cut into a sample of a size of 80 mm×$_{80mm}$, a surface was degreased, and a primary weighing process (W1: 0.0000 g) was performed using a high precision scale. Then, an O-Ring of 54.5 mm dia dedicated column was attached with a clamp on a front portion of specimen and was adhered to prevent leakage of a solution. A 30 cc of 1:3 HCl solution was input, and 2 or 3 drops of inhibitor were input. After the generation of a $H_2$ gas was terminated, the solution was collected in a 100 cc mass flask. All residue amount of the solution on the surface was collected using a wash bottle, and 100 cc or less of the solution was collected. The sample was completely dried, a secondary weighing process (W2) was performed, and a value obtained by dividing a difference between a primary weighing value and a secondary weighing value by a unit area was determined as a total coating amount of the zinc alloy plated steel material. A content of Mg in the collected solution was measured by a ICP method, and the obtained result was determined as a ratio of a content of Mg.

An average grain size of grains forming the Zn—Mg alloy plated layer was measured. As a result of the measurement, an average grain size of grains forming the Zn—Mg alloy plated layer was 100 nm or less.

Weldability and corrosion resistance of the manufactured zinc alloy plated steel were tested, and the results were listed in Table 1 below as well.

More specifically, as for weldability, the steel material was cut into a sample of a size of 40 mm×120 mm in accordance with SEP 1220-2 standard, spot-welding was performed 100 times on each sample, a presence and a size of Type B crack were measured, and the results were examined in accordance with the references as below.

1. Very good: Type B crack was not created in all samples
2. Good: Type B crack was created in portions of or overall samples, and an average length of Type B crack was 0.1 times or lower than a thickness of the base steel (cold-rolled steel sheet)
3. Average: Type B crack was created in portions of or overall samples, and an average length of Type B crack was less than 0.2 times of a thickness of the base steel (cold-rolled steel sheet)
4. Defect: Type B crack was created in portions of or overall samples, and an average length of Type B crack exceeded 0.2 times of a thickness of the base steel (cold-rolled steel sheet)

As for corrosion resistance, each of the multilayer zinc alloy plated steels was cut into a sample of a size of 75 mm×150 mm, a salt spray test was performed under JIS 22371, an initial red rust generation time was measured, and the result was examined in accordance with the references as below.

1. Excellent: a red rust generation time was twice longer as compared to a galvanized steel sheet (GI steel sheet) of a single-side coating amount of 60 g/m$^2$
2. Average: a red rust generation time was the same as or less than twice longer as compared to a galvanized steel sheet (GI steel sheet) of a single-side coating amount of 60 g/m$^2$
3. Defect: a red rust generation time was shorter as compared to a galvanized steel sheet (GI steel sheet) of a single-side coating amount of 60 g/m$^2$

TABLE 1

| No. | Thickness of Zn Plated Layer (μm) | Thickness of Mg Deposition layer (μm) | Mg Weight Ratio | Spot-Weldability | Corrosion Resistance | Note |
| --- | --- | --- | --- | --- | --- | --- |
| 1 | 2 | 0.96 | 0.105 | 4 | 1 | Comparative Example 1 |
| 2 | 2 | 1.15 | 0.123 | 3 | 1 | Comparative Example 2 |
| 3 | 2 | 1.20 | 0.127 | 3 | 1 | Comparative Example 3 |

TABLE 1-continued

| No. | Thickness of Zn Plated Layer (μm) | Thickness of Mg Deposition layer (μm) | Mg Weight Ratio | Spot-Weldability | Corrosion Resistance | Note |
|---|---|---|---|---|---|---|
| 4 | 2 | 1.24 | 0.131 | 2 | 1 | Inventive Example 1 |
| 5 | 2 | 1.51 | 0.155 | 2 | 1 | Inventive Example 2 |
| 6 | 2 | 1.54 | 0.158 | 1 | 1 | Inventive Example 3 |
| 7 | 2 | 1.68 | 0.170 | 1 | 1 | Inventive Example 4 |
| 8 | 2 | 1.80 | 0.180 | 1 | 1 | Inventive Example 5 |
| 9 | 2.5 | 2.25 | 0.180 | 1 | 1 | Inventive Example 6 |
| 10 | 3 | 2.70 | 0.180 | 1 | 1 | Inventive Example 7 |
| 11 | 4 | 3.60 | 0.180 | 1 | 1 | Inventive Example 8 |
| 12 | 4.5 | 4.05 | 0.180 | 2 | 1 | Inventive Example 9 |
| 13 | 2 | 2.03 | 0.198 | 1 | 1 | Inventive Example 10 |
| 14 | 2 | 2.08 | 0.202 | 2 | 1 | Inventive Example 11 |
| 15 | 2 | 2.25 | 0.215 | 2 | 1 | Inventive Example 12 |
| 16 | 2 | 2.45 | 0.230 | 2 | 1 | Inventive Example 13 |
| 17 | 2 | 2.57 | 0.238 | 3 | 1 | Comparative Example 4 |
| 18 | 2 | 2.61 | 0.241 | 3 | 1 | Comparative Example 5 |
| 19 | 2 | 2.74 | 0.250 | 4 | 1 | Comparative Example 6 |

Referring to Table 1, inventive example 1 to 13 satisfying the overall conditions suggested in the present disclosure had excellent corrosion resistance and spot-weldability. Further, to secure more excellent spot-weldability, it has been found that a preferable ratio of a content of Mg may be 0.157 to 0.20, and that it may be preferable to control a sum of coating amounts of the Zn plated layer and the Zn—Mg alloy plated layer to be 35 g/m² or lower.

As for comparative examples 1 to 6, a ratio of a content of Mg was beyond the range suggested in the present disclosure, and spot-weldability was deteriorated.

Figure 5:
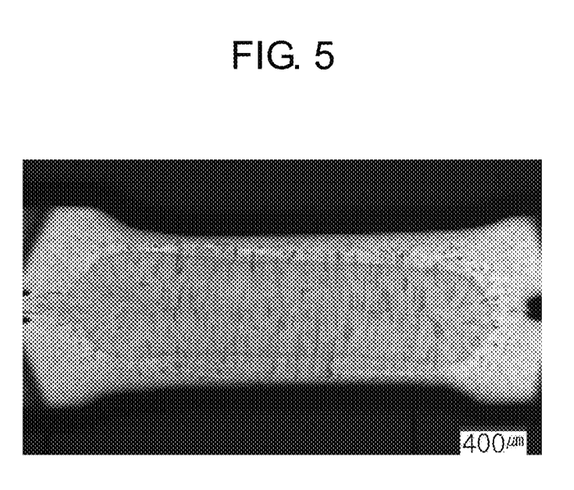
FIG. 5 is an image obtained by observing a welded portion after spot-welding a zinc alloy plated steel of inventive example 5.

FIG. 5 is an image obtained by observing a welded portion after spot-welding the zinc alloy plated steel material of inventive example 5. Referring to FIG. 5, it may be visually observed that Type B cracks and Type C cracks were not created at all in the welded portion in the zinc alloy plated steel material.

While the exemplary embodiments have been shown and described above, it will be apparent to those skilled in the art that modifications and variations could be made without departing from the scope of the present invention as defined by the appended claims.

The invention claimed is:

1. A zinc alloy plated steel, comprising:
   a base steel;
   a Zn plated layer formed on the base steel; and
   a Zn—Mg alloy plated layer formed on the Zn plated layer and obtained through mutual diffusion of Zn and Mg,
   wherein a ratio of weight of Mg contained in the Zn—Mg alloy plated layer based on a total weight of the Zn plated layer and the Zn—Mg alloy plated layer is 0.13 to 0.24, and a sum of coating amounts of the Zn plated layer and the Zn—Mg alloy plated layer is 40 g/m² or less, excluding 0 g/m², and
   wherein an average grain size of grains forming the Zn—Mg alloy plated layer is 100 nm or less, excluding 0 nm.

2. The zinc alloy plated steel of claim 1, wherein the ratio of weight is 0.157 to 0.20.

3. The zinc alloy plated steel of claim 1, wherein the sum of coating amounts is 10 to 35 g/m².

4. The zinc alloy plated steel of claim 1,
   wherein, during spot-welding the zinc alloy plated steel, the Zn plated layer and the Zn—Mg alloy plated layer on a welded portion are transformed to an alloy layer formed as a single layer, and
   wherein the alloy layer formed as a single layer on the welded portion comprises an MgZn₂ alloy phase of 90 area % or higher including 100 area %.

5. The zinc alloy plated steel of claim 1, wherein, when a spot-welding process is performed in accordance with SEP 1220-2 standard, an average length of Type B crack is 0.1 times or less than a thickness of the base steel.

6. The zinc alloy plated steel of claim 1, wherein the Zn plated layer is a Zn plated layer formed through electroplating, or a Zn plated layer formed through physical vapor deposition.

7. The zinc alloy plated steel of claim 1, wherein the base steel comprises, by wt %, 0.10 to 1.0% of C, 0.5 to 3% of Si, 1.0 to 25% of Mn, 0.01 to 10% of Al, 0.1% or less of P excluding 0%, 0.01% or less of S excluding 0%, and a balance of Fe and inevitable impurities.

8. The zinc alloy plated steel of claim 7, wherein contents of C, Si, Mn, P, and S included in the base steel satisfy Relational Expression 1 below:

$$[C]+[Mn]/20+[Si]/30+2[P]+4[S]\geq 0.3 \quad \text{[Relational Expression 1]}$$

where [C], [Mn], [Si], [P], and [S] each indicates a content, wt %, of each element.

9. The zinc alloy plated steel of claim 7, wherein the base steel comprises one or more of austenite and retained austenite as a microstructure.

* * * * *